US012660612B2

(12) United States Patent
Zhou et al.

(10) Patent No.: US 12,660,612 B2
(45) Date of Patent: Jun. 16, 2026

(54) HIGH DENSITY BACKSIDE MIM CAPACITOR

(71) Applicant: INTERNATIONAL BUSINESS MACHINES CORPORATION, Armonk, NY (US)

(72) Inventors: Huimei Zhou, Albany, NY (US); Yoo-Mi Lee, Montvale, NJ (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 18/326,055

(22) Filed: May 31, 2023

(65) Prior Publication Data

US 2024/0404942 A1 Dec. 5, 2024

(51) Int. Cl.
| | |
|---|---|
| H10W 20/40 | (2026.01) |
| H10D 62/10 | (2025.01) |
| H10W 20/41 | (2026.01) |
| H10W 20/42 | (2026.01) |

(52) U.S. Cl.
CPC ........ H10W 20/496 (2026.01); H10D 62/118 (2025.01); H10W 20/42 (2026.01); H10W 20/427 (2026.01)

(58) Field of Classification Search
CPC ............. H01L 23/5223; H01L 23/5226; H01L 23/5286; H10D 62/118; H10W 20/496; H10W 20/42; H10W 20/427

USPC .......................................................... 257/532
See application file for complete search history.

(56) References Cited

U.S. PATENT DOCUMENTS

| | | | |
|---|---|---|---|
| 7,473,979 B2 * | 1/2009 | Clevenger | .............. H10D 86/01 |
| | | | 257/532 |
| 8,361,875 B2 | 1/2013 | Zhu | |
| 8,759,947 B2 | 6/2014 | Tan | |
| 10,083,910 B2 | 9/2018 | Lee | |
| 10,714,420 B1 | 7/2020 | Rubin | |
| 11,062,988 B2 | 7/2021 | Liao | |
| 2010/0230735 A1 | 9/2010 | Zhu | |
| 2022/0293513 A1 | 9/2022 | Li | |
| 2022/0367489 A1 | 11/2022 | Chang | |

OTHER PUBLICATIONS

Lin et al., "84%-Efficiency Fully Integrated Voltage Regulator for Computing Systems Enabled by 2.5-D High-Density MIM Capacitor", IEEE Transactions on Very Large Scale Integration (VLSI) Systems, vol. 30, No. 5, May 2022, pp. 661-665.
Pending U.S. Appl. No. 17/851,290, filed Jun. 28, 2022, entitled: "Ferroelectric Film with Buffer Layers for Improved Reliability of Metal-Insulator-Metal Capacitor", 26 pages.

(Continued)

*Primary Examiner* — Tu-Tu V Ho
(74) *Attorney, Agent, or Firm* — L. Jeffrey Kelly

(57) ABSTRACT

A semiconductor structure including an array of transistors, a backside power rail, wherein the backside power rail directly contacts a bottommost surface of a shallow trench isolation region, and a metal-insulator-metal (MIM) capacitor embedded in a backside power delivery network beneath the array of transistors, wherein the MIM capacitor directly contacts a bottommost surface of the backside power rail.

14 Claims, 22 Drawing Sheets

SECTION A-A

(56) References Cited

OTHER PUBLICATIONS

Prasad et al., "Buried Power Rails and Back-side Power Grids: Arm® CPU Power Delivery Network Design Beyond 5nm", 2019 IEEE, IEDM19, pp. 19.1.1-19.1.4.
Zeng et al., "The Reliability Study of MIM Capacitor Built On Top of Backside Via In III-V Compound MMIC", Published 2006, Engineering, Semantic Scholar, 3 pages.

* cited by examiner

SECTION A-A

*SECTION B-B*

*SECTION A-A*

SECTION B-B

100

SECTION A-A

*SECTION B-B*

SECTION A-A

SECTION B-B

*SECTION A-A*

SECTION B-B

*SECTION A-A*

100

*SECTION B-B*

*SECTION A-A*

*SECTION B-B*

HIGH DENSITY BACKSIDE MIM CAPACITOR

BACKGROUND

The present invention generally relates to semiconductor structures, and more particularly to a high-density backside metal-insulator-metal capacitor.

Power delivery distribution networks for conventional 3D monolithic designs typically have parallel power busses (e.g., VDD and ground) that are formed as part of a metallization level of a back-end-of-line (BEOL) interconnect network. Vertical interconnects are used to route ground and VDD connections from the upper power busses in the BEOL to the underlying devices.

Such conventional power distribution network solutions for 3D monolithic IC designs present unique challenges. For example, conventional power distribution networks occupy a significant amount of area in each IC layout, thereby limiting integration density.

SUMMARY

According to an embodiment of the present invention, a semiconductor structure is provided. The semiconductor structure may include an array of transistors, a backside power rail, wherein the backside power rail directly contacts a bottommost surface of a shallow trench isolation region, and a metal-insulator-metal (MIM) capacitor embedded in a backside power delivery network beneath the array of transistors, wherein the MIM capacitor directly contacts a bottommost surface of the backside power rail.

According to another embodiment of the present invention, a semiconductor structure is provided. The semiconductor structure may include an array of transistors, a backside power rail, and a metal-insulator-metal (MIM) capacitor beneath the array of transistors, wherein a metal layer of the MIM capacitor directly contacts the backside power rail.

According to another embodiment of the present invention, a semiconductor structure is provided. The semiconductor structure may include an array of transistors, a backside power rail, and a metal-insulator-metal (MIM) capacitor beneath the array of transistors, wherein a metal layer of the MIM capacitor directly contacts the backside power rail.

BRIEF DESCRIPTION OF THE DRAWINGS

The following detailed description, given by way of example and not intended to limit the invention solely thereto, will best be appreciated in conjunction with the accompanying drawings, in which.

Figure 1:
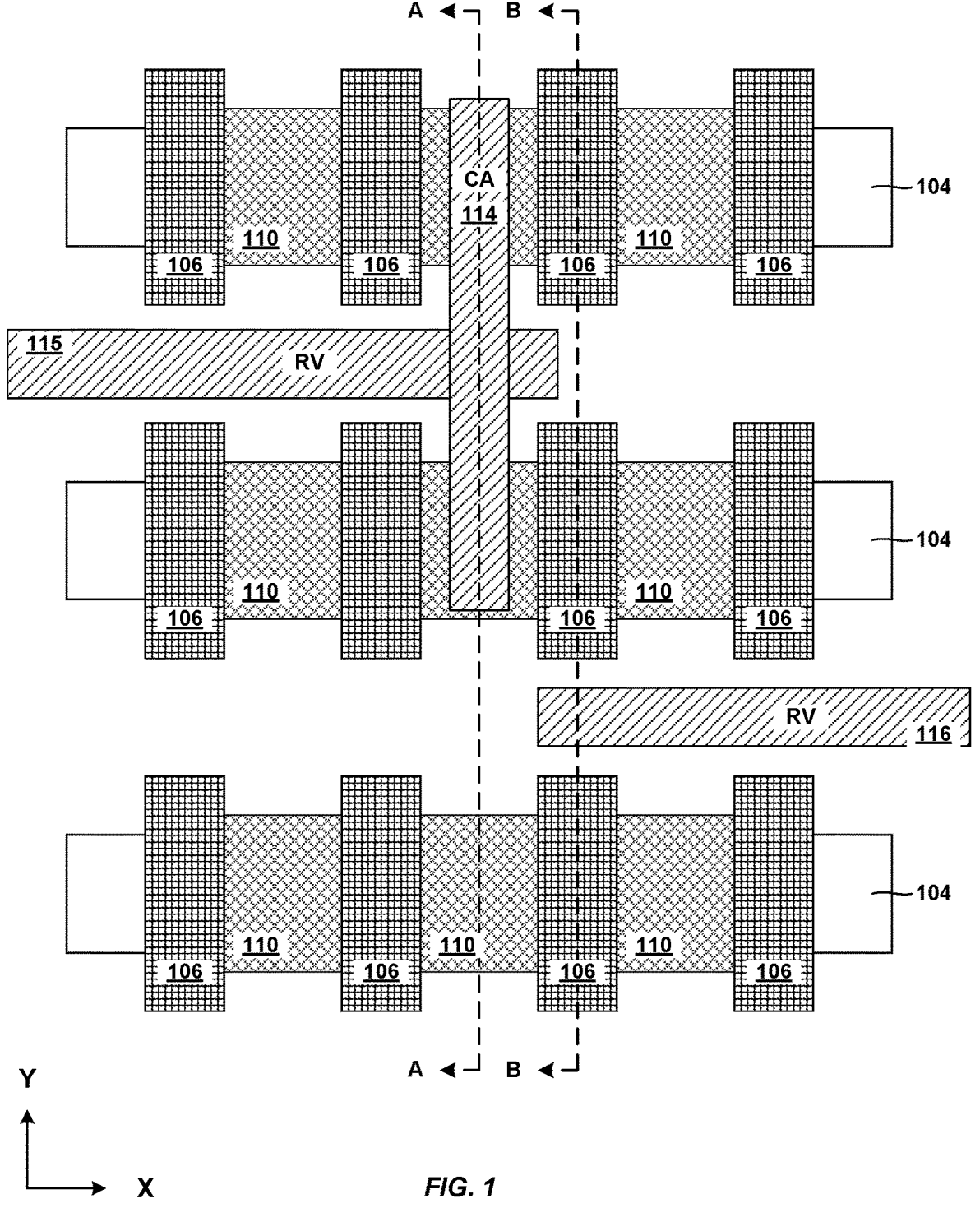
FIGS. 1, 2, and 3 depict views of a semiconductor structure during an intermediate step of a method of fabricating a transistor structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Transistors are used as a capacitor for various functions in digital and analog circuits; however, doing so does have some drawbacks. For example, (1) its capacitances vary nonlinearly depending on the bias applied and (2) it requires a large wafer real estate.

The present invention generally relates to semiconductor structures, and more particularly to a high-density backside metal-insulator-metal capacitor. More specifically, the structures and associated methods disclosed herein enable a novel solution for providing unique metal-insulator-metal capacitor formed during backside processing and embedded in a backside power distribution network. The unique metal-insulator-metal capacitors disclosed herein have some advantages over FET capacitors. For example, (1) their capacitance is constant over applied input voltage and (2) they are highly linear nature and dynamic range. The capacitance density of the disclosed metal-insulator-metal capacitors can be comparable to FET capacitance by design. MIM cap; however, is available at far BEOL level so it requires a large process overhead. In sum, the metal-insulator-metal capacitors disclosed herein can replace many functions especially de-coupling capacitance offered by FEOL FET capacitors with compatible or better performance and significant chip area reduction by direct connections with backside power distribution network.

Exemplary embodiments of the unique metal-insulator-metal capacitor are described in detail below by referring to the accompanying drawings in FIGS. 1 to 22. Those skilled in the art will readily appreciate that the detailed description given herein with respect to these figures is for explanatory purposes as the invention extends beyond these limited embodiments.

Figure 2:
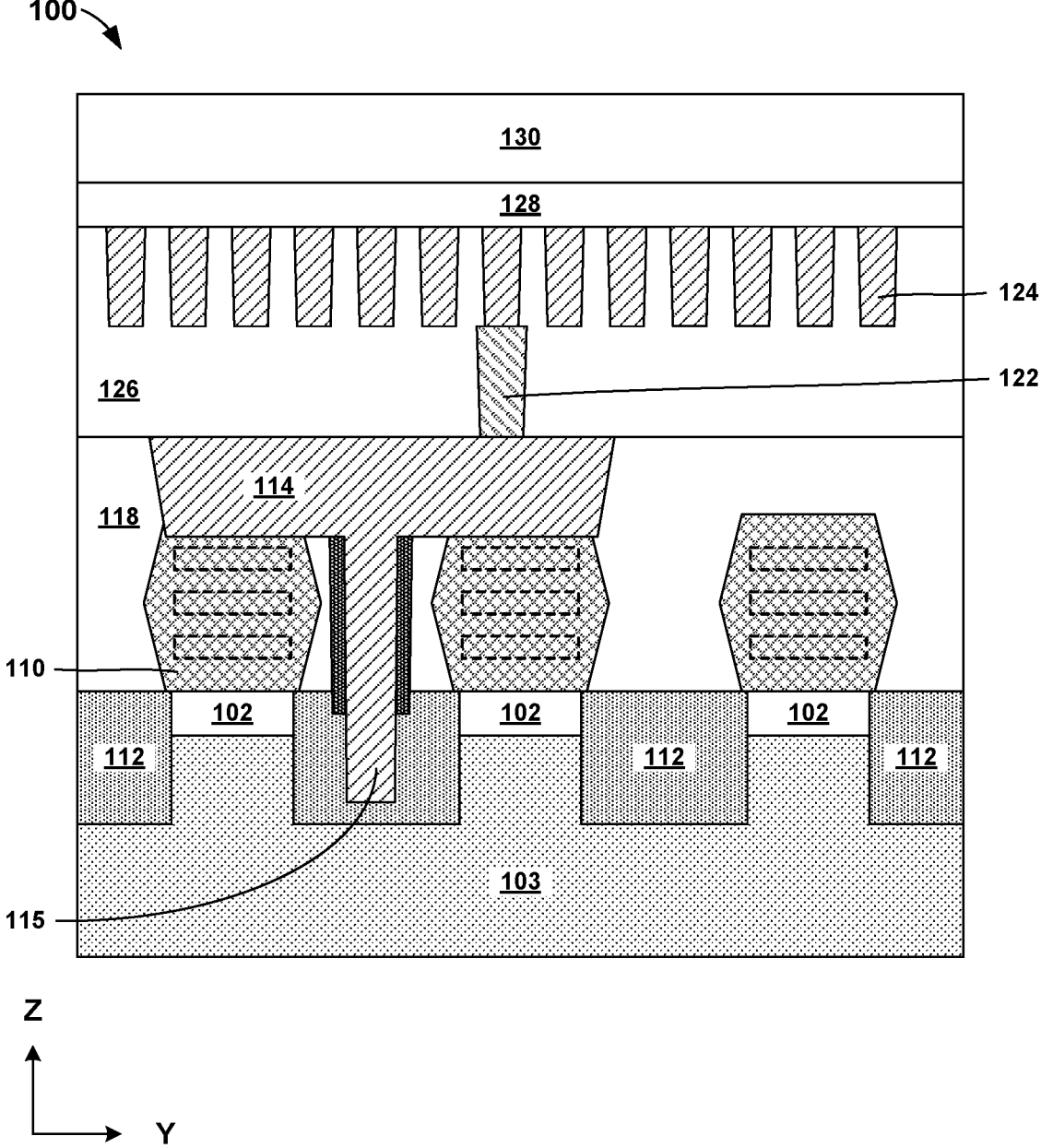
Figure 3:
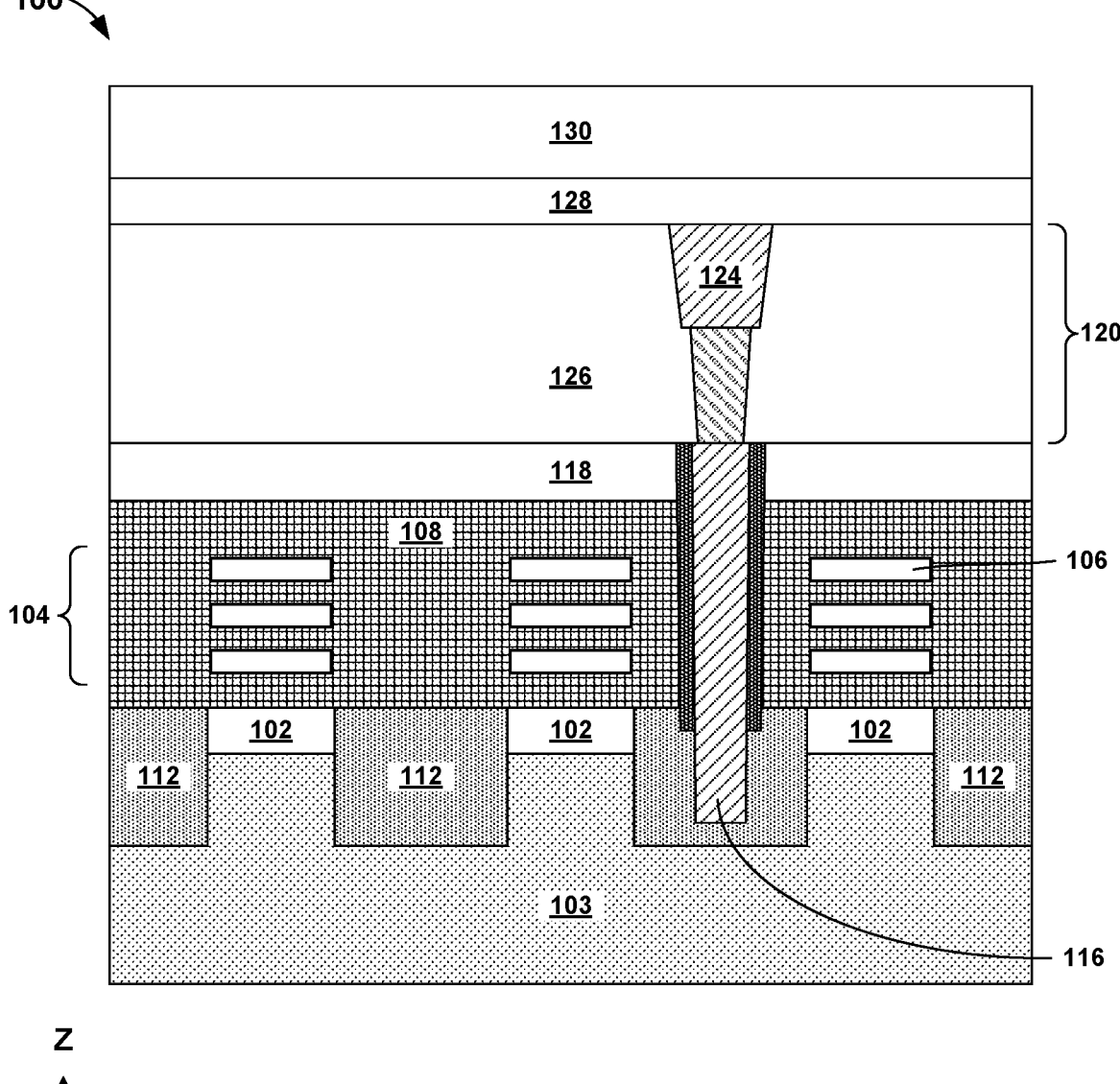

Referring now to FIGS. 1, 2, and 3, a structure 100 is shown during an intermediate step of a method of fabricating a semiconductor structure with high-density backside metal-insulator-metal capacitor according to an embodiment of the invention. FIG. 1 is a representative illustration of a top view of the structure 100 omitting some materials and layers, for example, patterning layers, masking layers and interlevel dielectrics. As such, only pertinent conductive layers and components are shown in the top views to provide a clear understanding of their relative orientation. FIG. 2 depicts a cross-sectional view of the structure 100 shown in FIG. 1 taken along line A-A. FIG. 3 depicts a cross-sectional view of the structure 100 shown in FIG. 1 taken along line B-B.

The structure 100 illustrated in FIGS. 1 and 2 include an array of nanosheet transistors formed on a substrate 102 above a buried dielectric layer 103 according to an embodiment of the invention. The substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. In practice, a conventional silicon substrate may suffice because a majority of the substrate will be subsequently removed, as described below. In the present case, the substrate 102 may be about, but is not limited to, several hundred microns thick, or at least thick enough to provide sufficient structural support for subsequent fabrication.

The buried dielectric layer 103 may include any of several dielectric materials, for example, oxides, nitrides and oxynitrides of silicon. The buried dielectric layer 103 may also include oxides, nitrides and oxynitrides of elements other than silicon. In addition, the buried dielectric layer 103 may include crystalline or non-crystalline dielectric material. Moreover, the buried dielectric layer 103 may be formed using any of several known methods, for example, thermal or plasma oxidation or nitridation methods, chemical vapor deposition methods, and physical vapor deposition methods. The buried dielectric layer 103 may have a thickness ranging from about 20 nm to about 200 nm.

As illustrated, the array of nanosheet transistors includes nanosheet stacks 104. Each nanosheet stack 104 includes a plurality of silicon channels 106 surrounded by a gate 108. The array of nanosheet transistors further includes source drain regions 110 disposed between adjacent stacks (104) in direct contact with exposed ends of the silicon channels 106. More specifically, the source drain regions 110 may be epitaxially grown from the exposed ends of the silicon channels 106 according to known techniques. For purposes of orientation, the substrate 102 is herein referred to as being on a "backside" of the structure 100 and the array of nanosheet transistors are herein referred to as being on a "frontside" of the structure 100. Further, certain features may be described herein as having a relative position with respect to the frontside or backside of the structure 100.

The structure 100 further includes shallow trench isolation regions 112 (hereinafter "STI regions") which extend partially into the substrate 102 below the array of nanosheet transistors according to an embodiment of the invention. The STI regions 112 may be formed from any appropriate dielectric material including, for example, silicon di-oxide ($SiO_2$) or silicon nitride (SiN).

The structure 100 further includes inner spacers (not shown) between alternate channels (106) according to an embodiment of the invention. The inner spacers laterally separate the gate 108 from the source drain regions 110. The inner spacers provide necessary electrical insulation between the gate 108 and the source drain regions 110.

When forming the gate 108, top gate spacers (not shown) are added to separate and electrically insulate the gate 108 from subsequently formed structures, such as, for example, contact structures. The top gate spacers are critical for electrically insulating the gate 108 from the source drain regions 110 or subsequently formed contact structures. In at least one embodiment, the top gate spacers include silicon nitride, silicon boron nitride, silicon carbon nitride, silicon boron carbon nitride, or other known equivalents.

The structure 100 further includes middle-of-line contacts according to an embodiment of the invention. The middle-of-line contacts may include source drain contacts 114, first vias 115, second vias 116, and gate contacts (not shown). According to embodiments of the present invention, some of the source drain contacts 114 are form directly on top of the source drain region 110, as illustrated. Some source drain contacts 114 provide electrical connections to frontside wiring, for example the back-end-of-line, while other source drain contacts 114 form electrical connections to backside wiring by way of the first vias 115, for example backside power delivery network or other backside metallization layers. As illustrated, the first vias 115 pass through the front-end-of-line between adjacent source drain regions 110.

Meanwhile, the second vias 116 are provided for electrical connections directly between the frontside and the backside without any connection to devices in the front-end-of-line. As illustrated, the second vias 116 pass through the front-end-of-line in a gate region between adjacent nanosheet stacks 104, as illustrated. Both the first vias 115 and the second vias 116 are embedded in a dielectric layer 118, such as, a known interlevel dielectric material, and further electrically insulated from surrounding structures with contact spacers 119.

The structure 100 further includes middle-of-line metallization layers 120 according to an embodiment of the invention. The middle-of-line metallization layers 120 typically include vias 122 and metal lines 124 forming electrical input or output connections to the array of nanosheet transistors. The vias 122 and metal lines 124 of the middle-of-line metallization layers 120 are embedded in a dielectric layer 126 according to known techniques.

The structure 100 further includes back-end-of-line layers 128 and a carrier wafer 130 according to an embodiment of the invention. The back-end-of-line layers 128 are formed according to known techniques. Next, the carrier wafer 130 is attached, or removably secured, to the back-end-of-line layers 128. In general, and not necessarily depicted, the carrier wafer 130 may be thicker than the other layers. Temporarily bonding the structure 100 to a thicker carrier provides improved handling and additional support for backside processing of thin wafers. After backside processing described below, the structure may be de-bonded, or removed, from the carrier wafer 130 according to known techniques.

Figure 4:
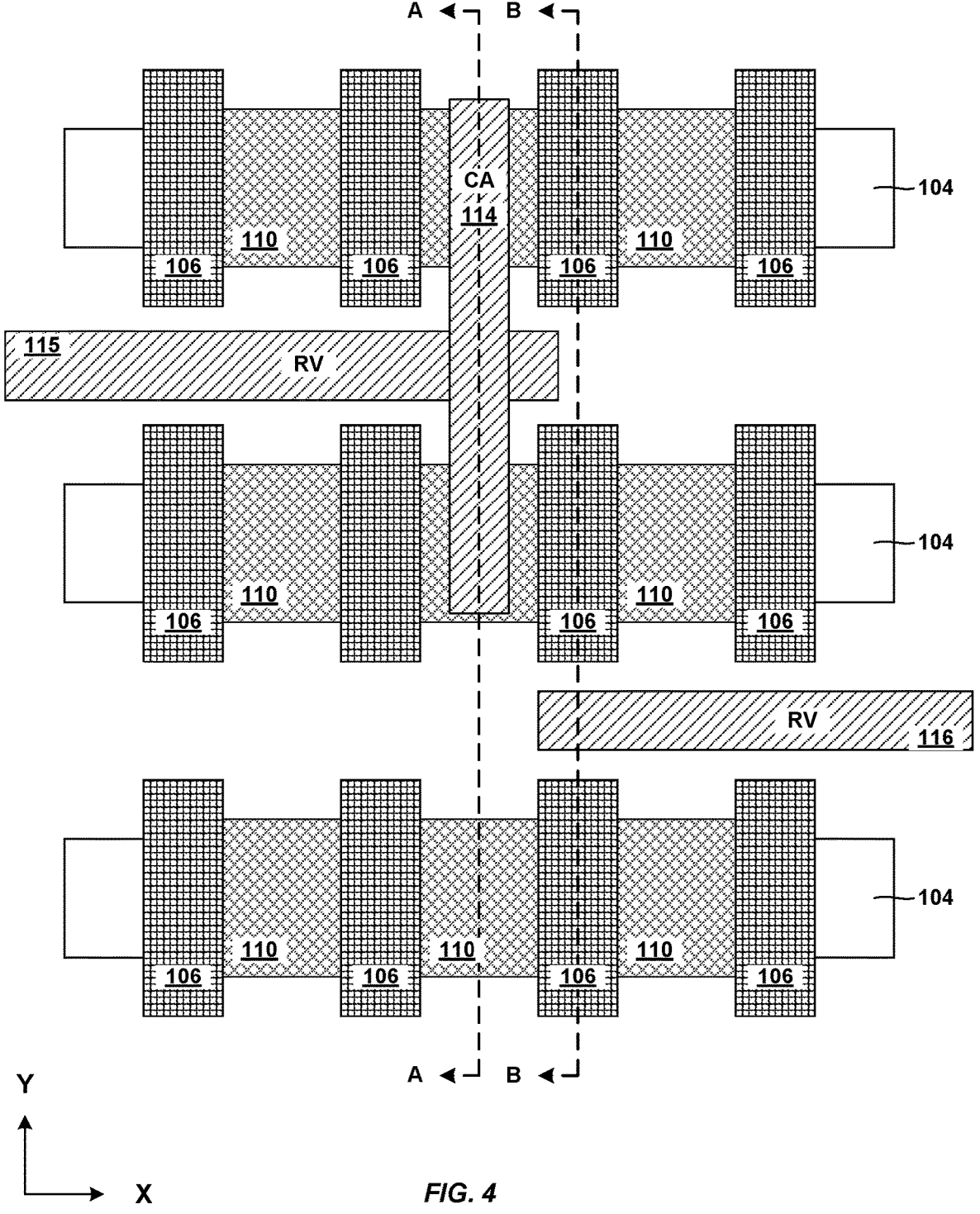
FIGS. 4, 5, and 6 depict views of a semiconductor structure after forming a backside power rail trench according to an exemplary embodiment.
Figure 5:
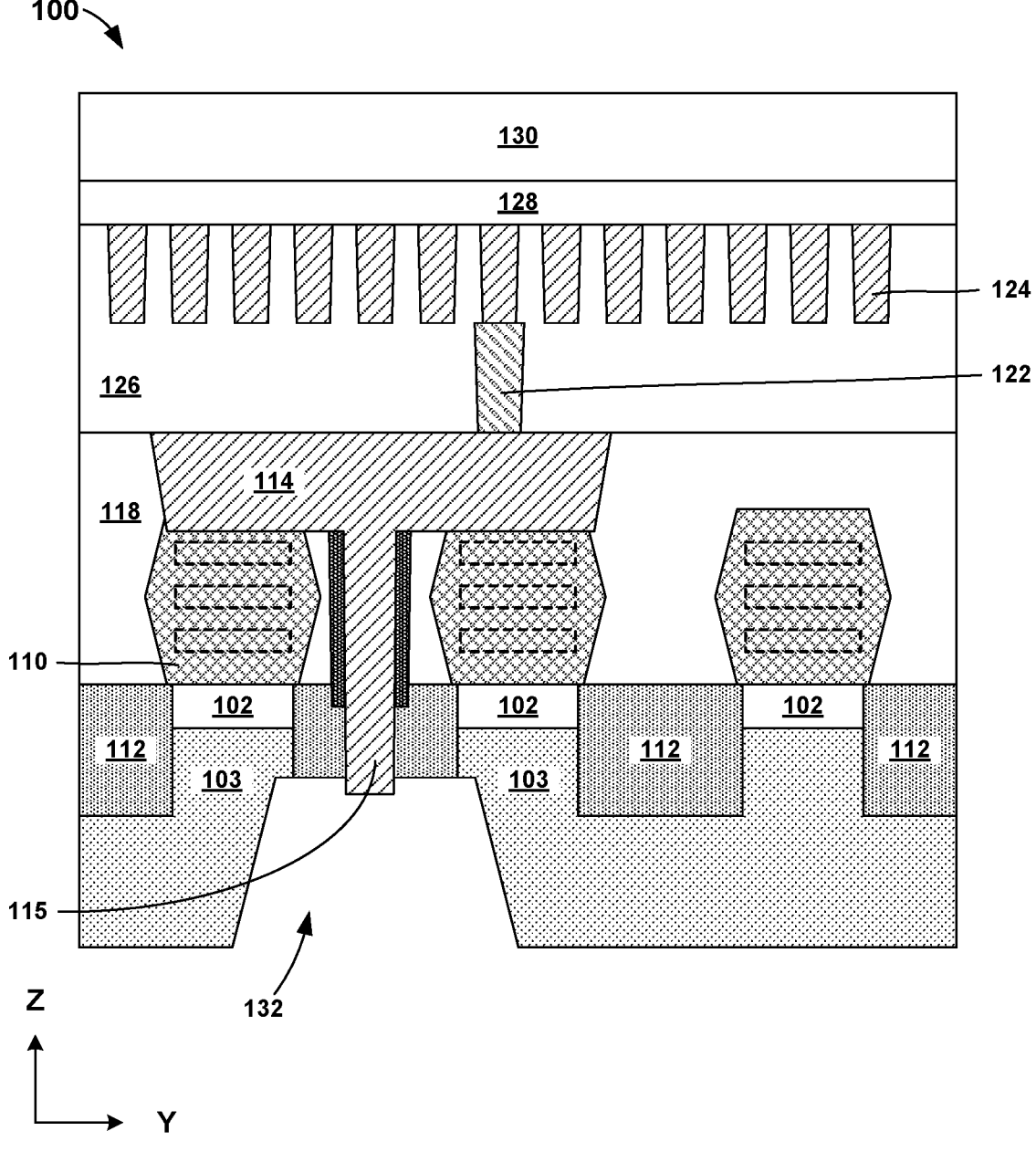
Figure 6:
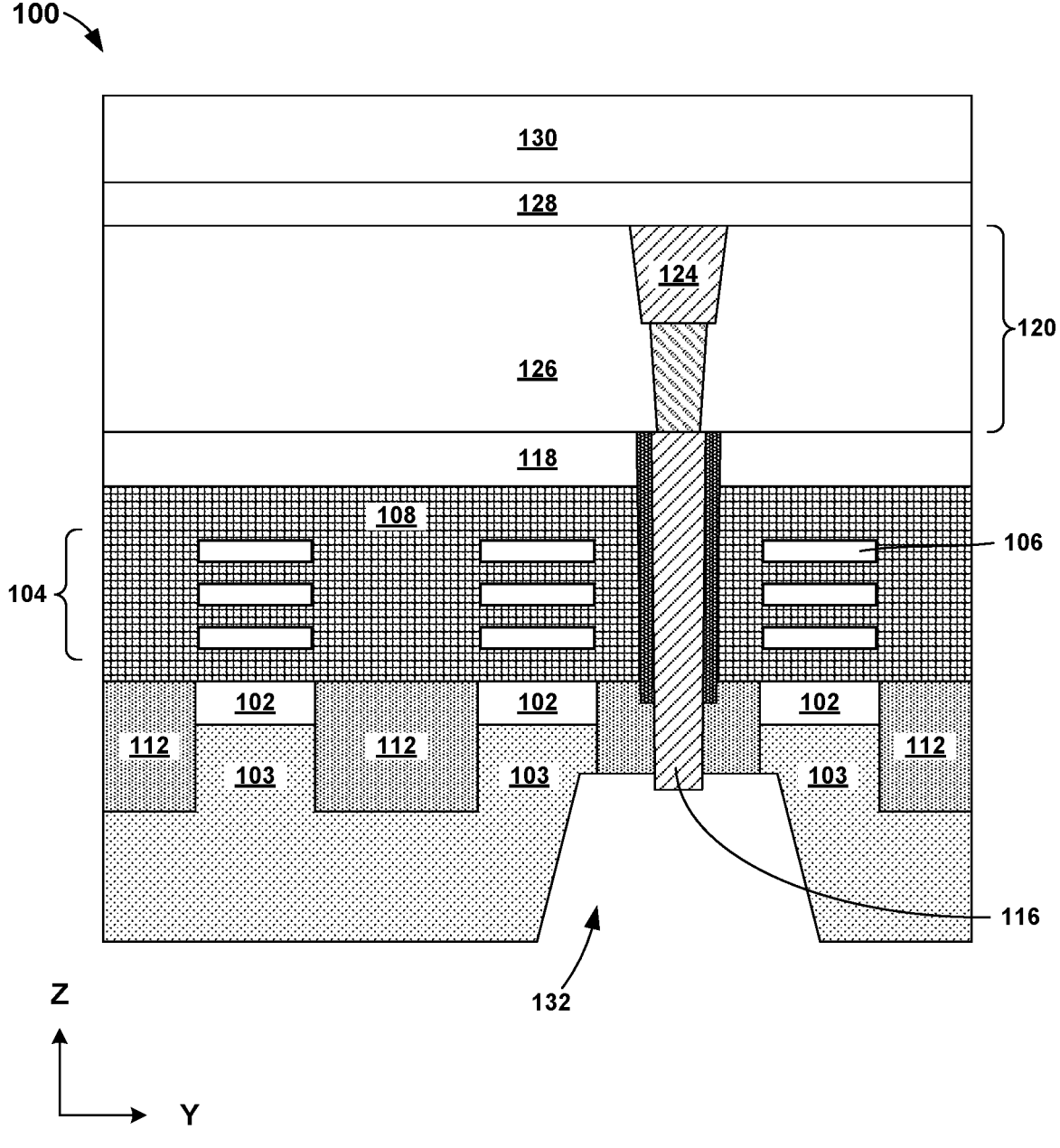

Referring now to FIGS. 4, 5, and 6, the structure 100 is shown after forming backside trenches 132 according to an embodiment of the invention. FIG. 4 is a representative illustration of a top view of the structure 100 omitting some features as described above with reference to FIG. 1. FIG. 5 depicts a cross-sectional view of the structure 100 shown in FIG. 4 taken along line A-A. FIG. 6 depicts a cross-sectional view of the structure 100 shown in FIG. 4 taken along line B-B.

First, the buried dielectric layer 103 is isotropically etched to form the backside trenches 132 according to known techniques. In doing so, a portion of the buried dielectric layer 103 is removed selective to a masking material. In all cases, etching continues until lowermost portions of the middle-of-line contacts 114, 116 are exposed, as illustrated. In some cases, etching may only expose a lowermost surface of the middle-of-line contacts 114, 116. In other cases, etching may expose a lowermost surface and sidewall portions of the middle-of-line contacts 114, 116.

Figure 7:
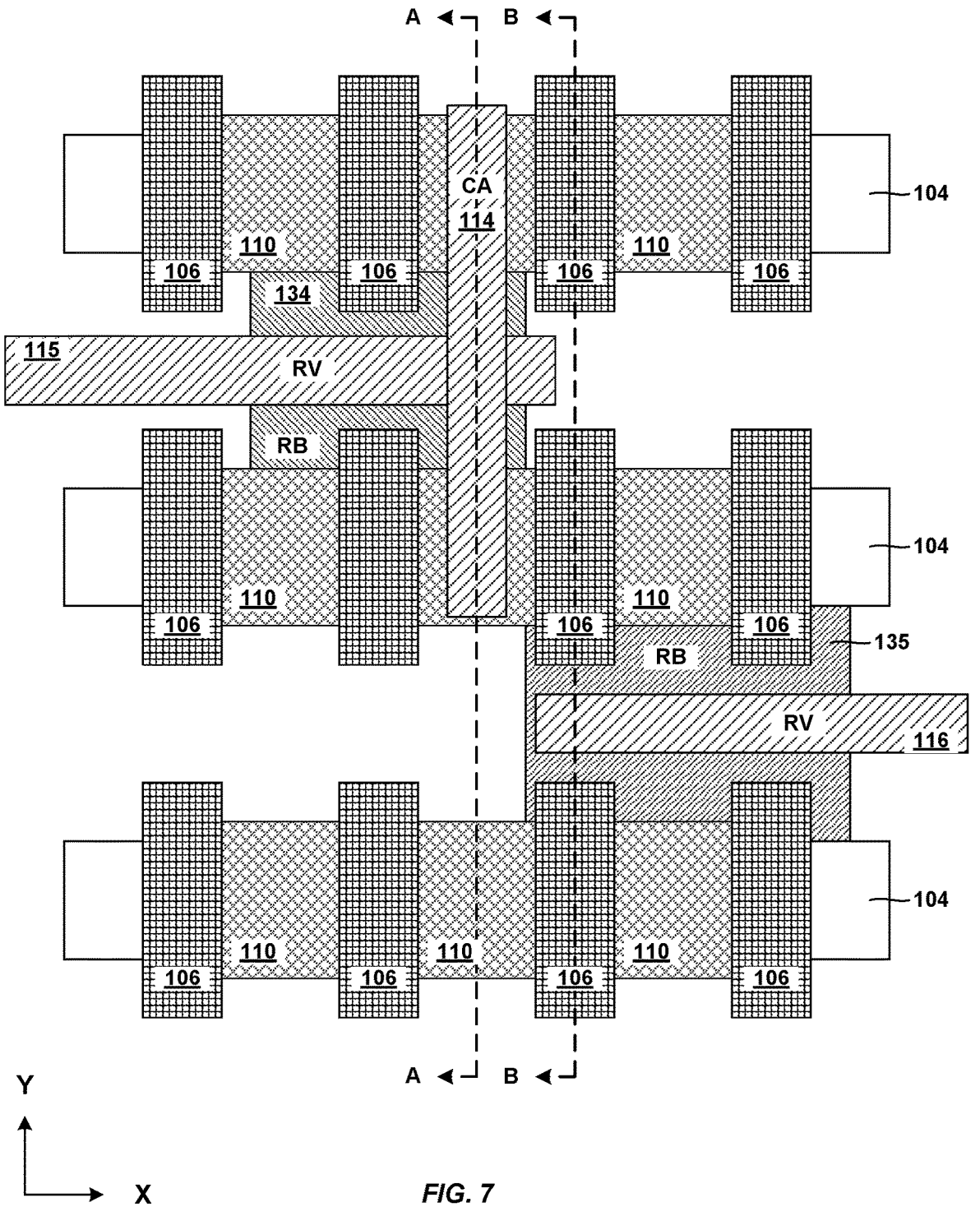
FIGS. 7, 8, and 9 depict views of a semiconductor structure after forming backside power rails according to an exemplary embodiment.
Figure 8:
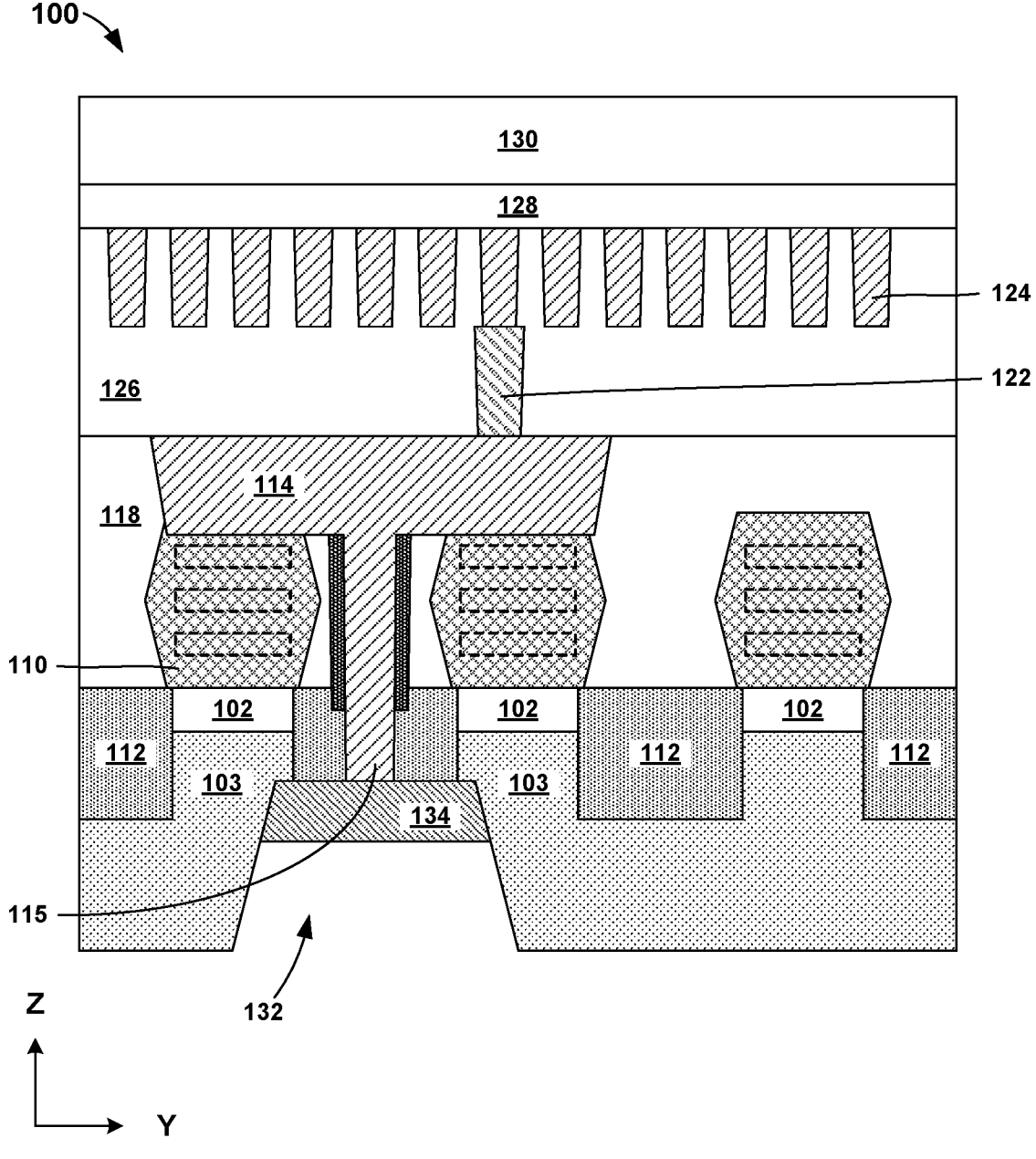
Figure 9:
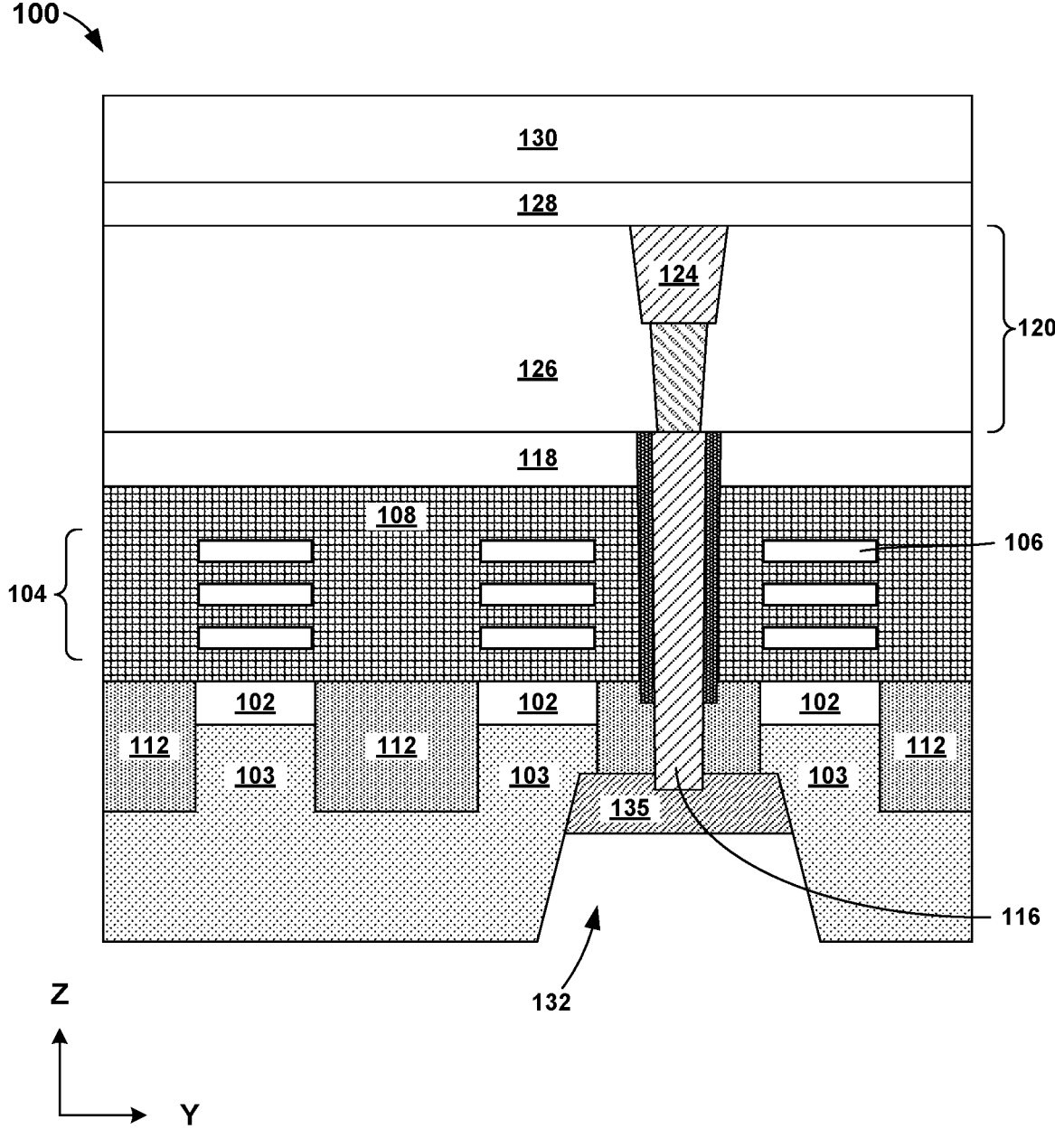

Referring now to FIGS. 7, 8, and 9, the structure 100 is shown after forming a backside power delivery network including backside power rails 134 and backside signal lines 135 according to an embodiment of the invention. FIG. 7 is a representative illustration of a top view of the structure 100 omitting some features as described above with reference to FIG. 1. FIG. 8 depicts a cross-sectional view of the structure 100 shown in FIG. 7 taken along line A-A. FIG. 9 depicts a cross-sectional view of the structure 100 shown in FIG. 7 taken along line B-B.

The backside power delivery network is formed by filling the backside trenches 132 with a suitable conductive material and subsequently recessing according to known techniques. First, the conductive material is deposited in the backside trenches 132 according to known techniques. Specifically, the conductive material may be, for example, ruthenium, tungsten, cobalt, or alloys thereof. Next, the conductive material is recessed as illustrated and according to known techniques to produce the backside power rails 134.

Figure 10:
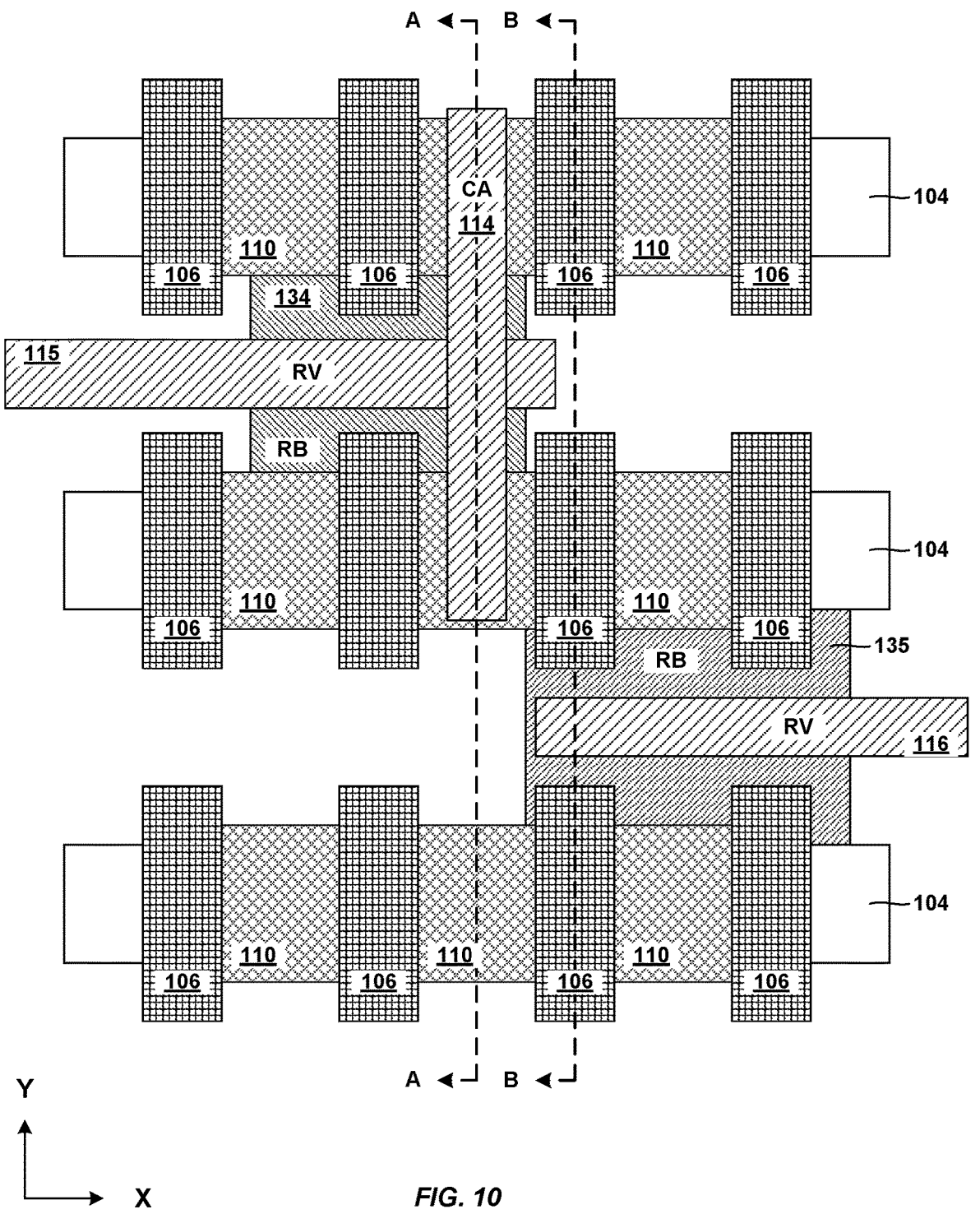
FIGS. 10, 11, and 12 depict views of a semiconductor structure after forming a first backfill dielectric layer according to an exemplary embodiment.
Figure 11:
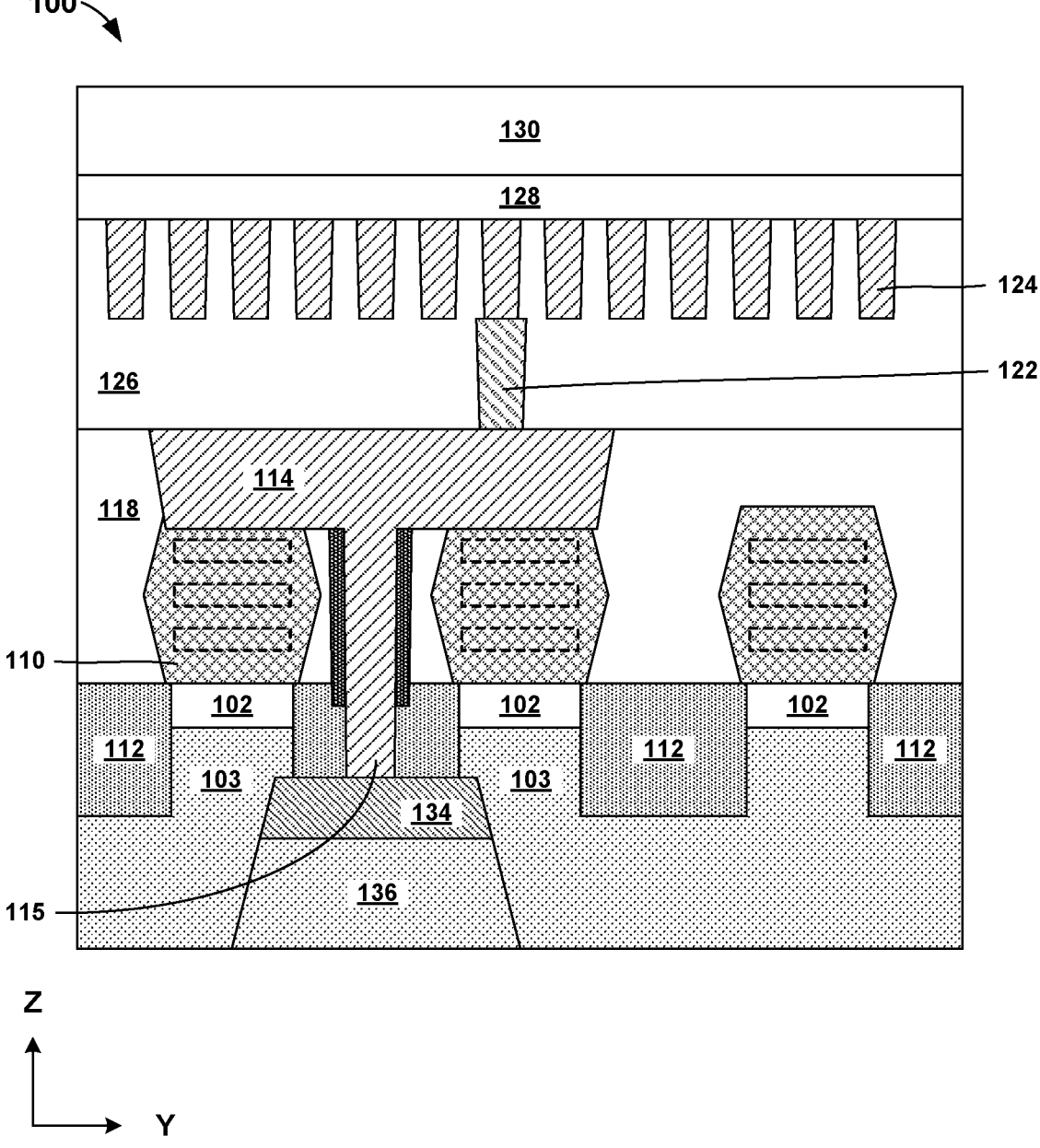
Figure 12:
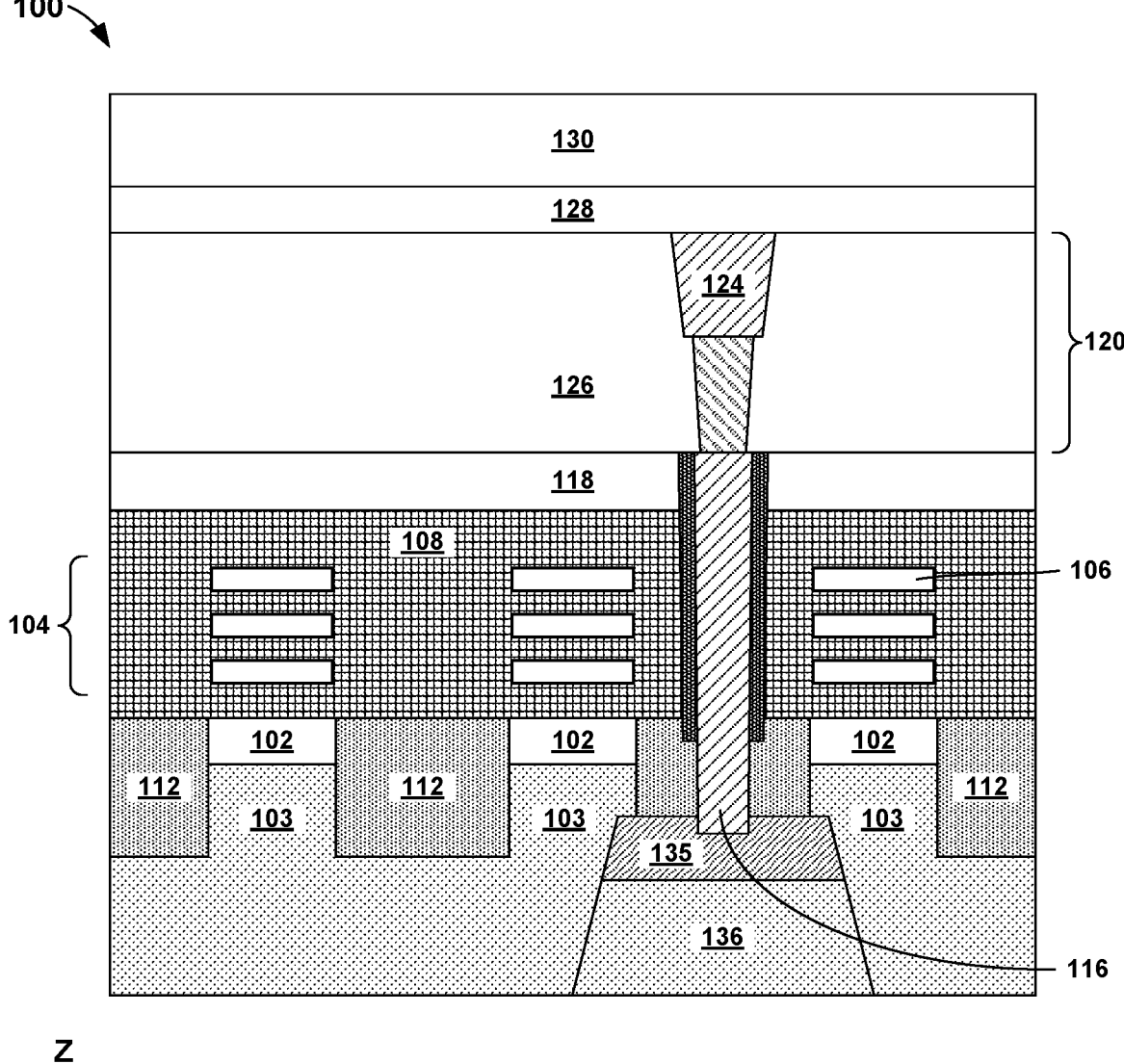

Referring now to FIGS. 10, 11, and 12, the structure 100 is shown after forming a first backfill dielectric layer 136 according to an embodiment of the invention. FIG. 10 is a representative illustration of a top view of the structure 100 omitting some features as described above with reference to FIG. 1. FIG. 11 depicts a cross-sectional view of the structure 100 shown in FIG. 10 taken along line A-A. FIG. 12 depicts a cross-sectional view of the structure 100 shown in FIG. 10 taken along line B-B.

The first backfill dielectric layer 136 is formed by blanket depositing another interlayer dielectric material over the structure 100 according to known techniques. Specifically, the first backfill dielectric layer 136 fills the backside trenches 132 and covers the backside power rails 134 and the backside signal lines 135, as illustrated.

Additionally, the first backfill dielectric layer 136 can be made from the same or different dielectric materials as the buried dielectric layer 103 described above. As such, despite the first backfill dielectric layer 136 and the buried dielectric layer 103 being depicted and described as separate structures, or layers, they may not be distinguishable in the final structure if made from the same, or similar, dielectric material.

Figure 13:
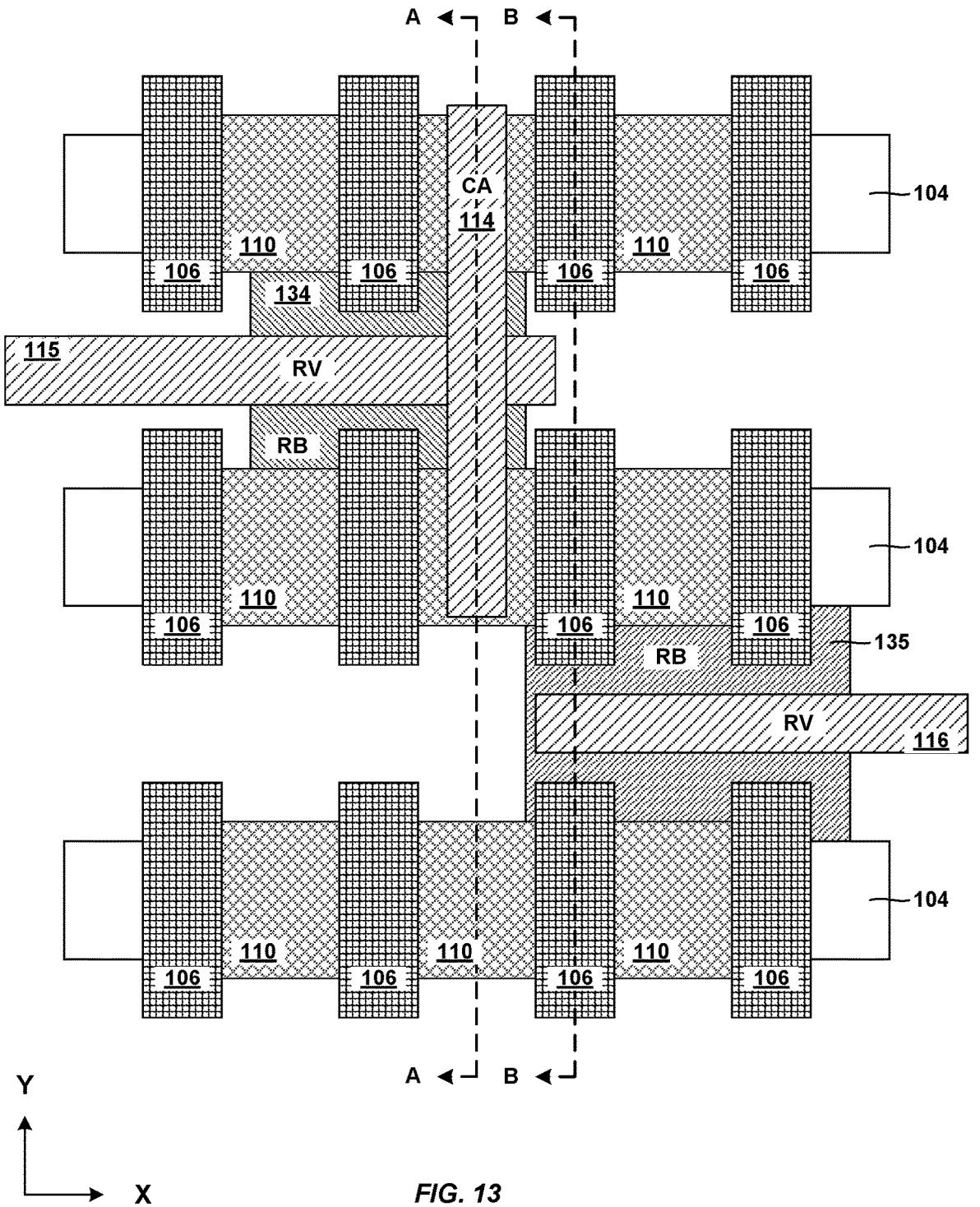
FIGS. 13, 14, and 15 depict views of a semiconductor structure after forming MIM pockets according to an exemplary embodiment.
Figure 14:
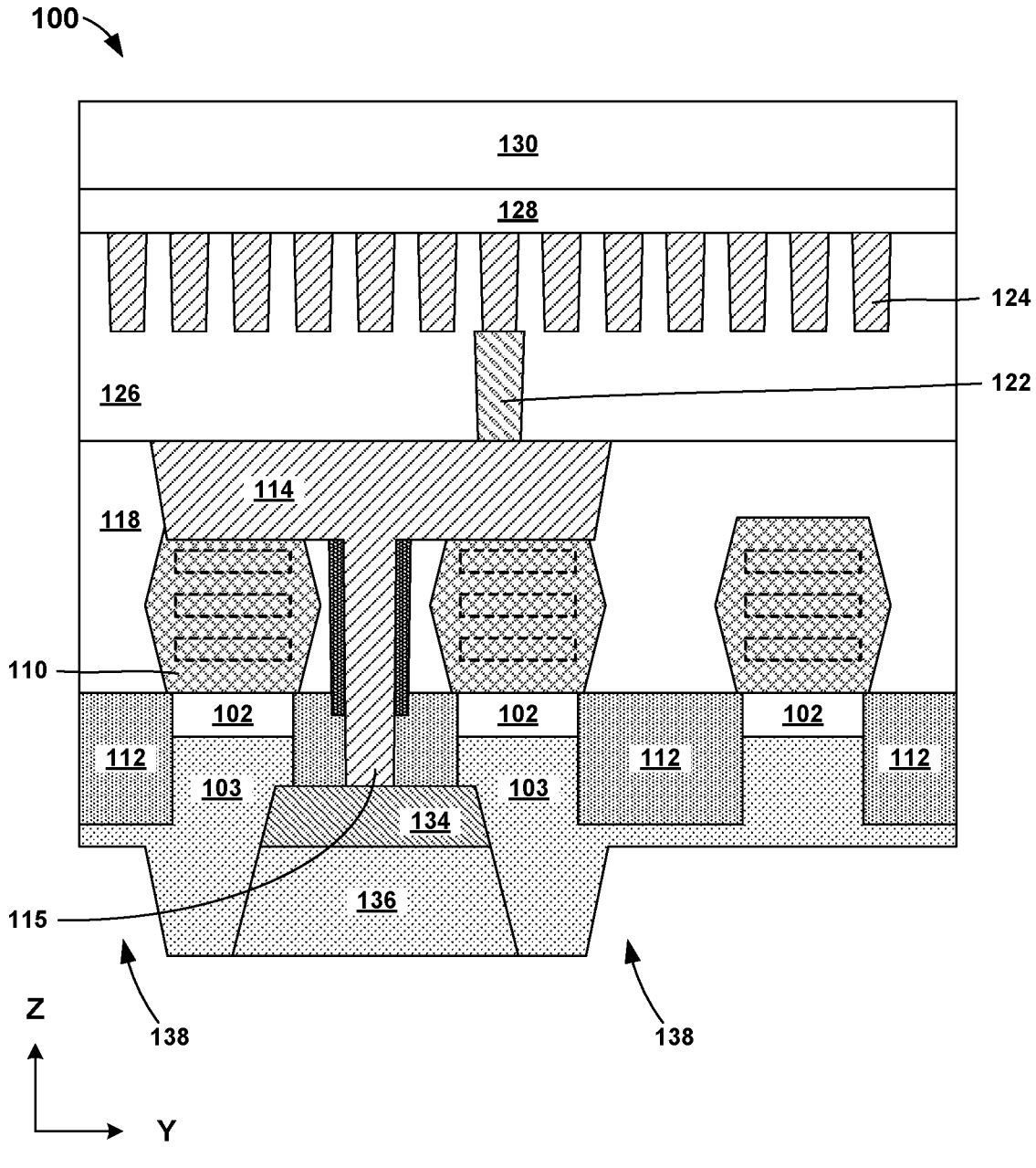
Figure 15:
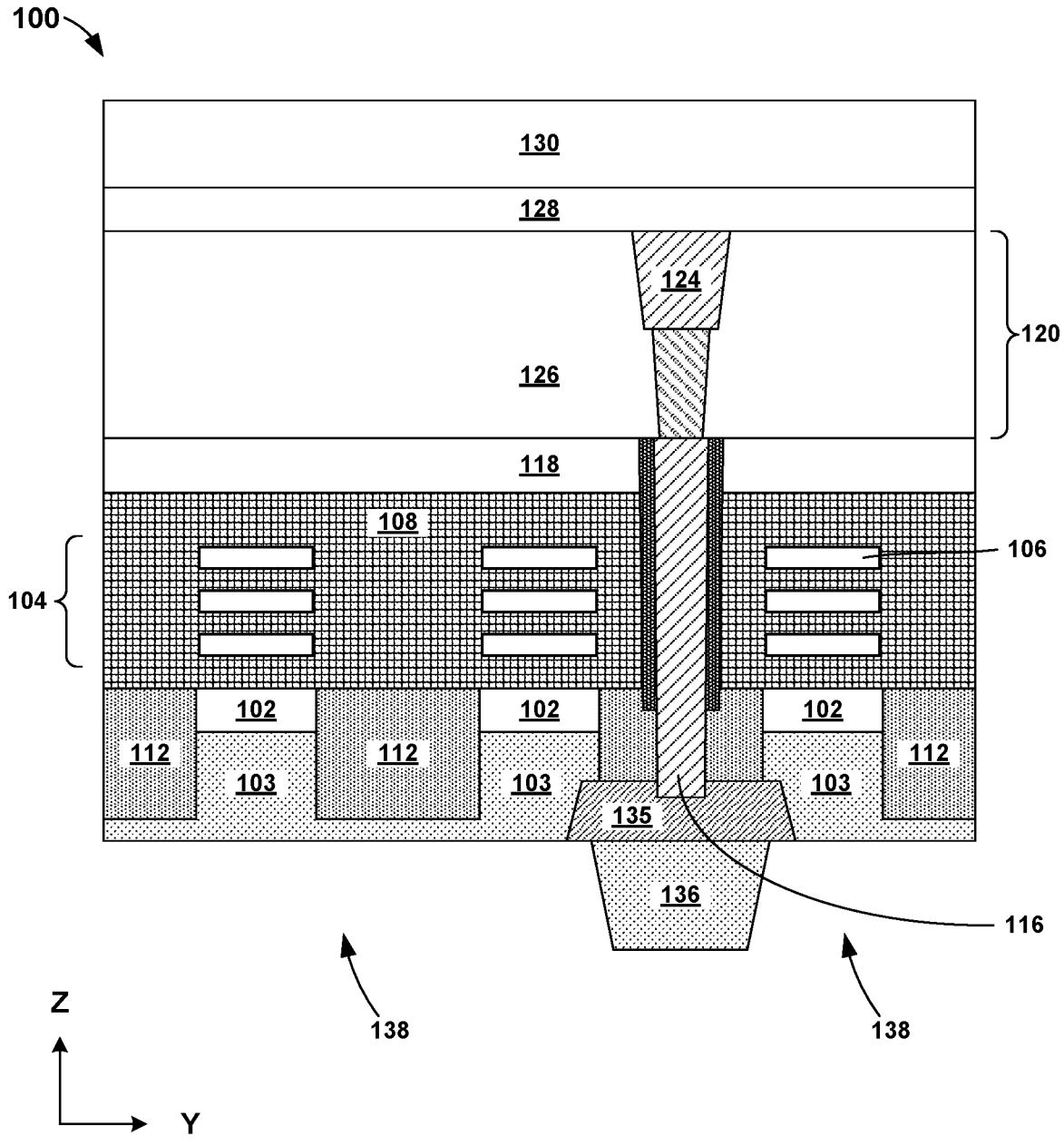

Referring now to FIGS. 13, 14, and 15, the structure 100 is shown after forming MIM pockets 138 according to an embodiment of the invention. FIG. 13 is a representative illustration of a top view of the structure 100 omitting some features as described above with reference to FIG. 1. FIG. 14 depicts a cross-sectional view of the structure 100 shown in FIG. 13 taken along line A-A. FIG. 15 depicts a cross-sectional view of the structure 100 shown in FIG. 13 taken along line B-B.

Next, the MIM pockets 138 are formed below the array of nanosheet devices in the first backfill dielectric layer 136 according to known techniques and as illustrated. Specifically, a mask (not shown) is first deposited and patterned to expose portions of the buried dielectric layer 103 and the first backfill dielectric layer 136 generally aligned with the backside power rails 134.

Next, known etching techniques are used to remove portions of the buried dielectric layer 103 and the first backfill dielectric layer 136 selective to the backside signal lines 135. Etching continues until lowermost surfaces of the backside signal lines 135 are exposed. Unique and critical to the embodiments disclosed herein, surfaces of the backside signal lines 135 are exposed in select regions only. For example, lowermost surfaces of the backside signal lines 135 are exposed generally beneath the gate 108. Furthermore, surfaces of the backside power rails 134 are not exposed, according to the embodiment illustrated in the figures. In practice, the mask may have any number of configurations as described in more detail below. For example, lowermost surfaces of the backside power rails 134 and the backside signal lines 135 may remain covered. In yet another example, portions of the backside signal lines 135 may be exposed in certain regions of the structure 100 while portions of the backside power rails 134 may be exposed in other regions of the structure 100. In all cases, the MIM pockets 138 are configured based on desired characteristics and functionality of subsequently formed MIM capacitor structures.

In at least an embodiment, a directional dry etching technique, such as reactive ion etching, is used to etch or remove portions of the first backfill dielectric layer 136 selective to the mask.

Figure 16:
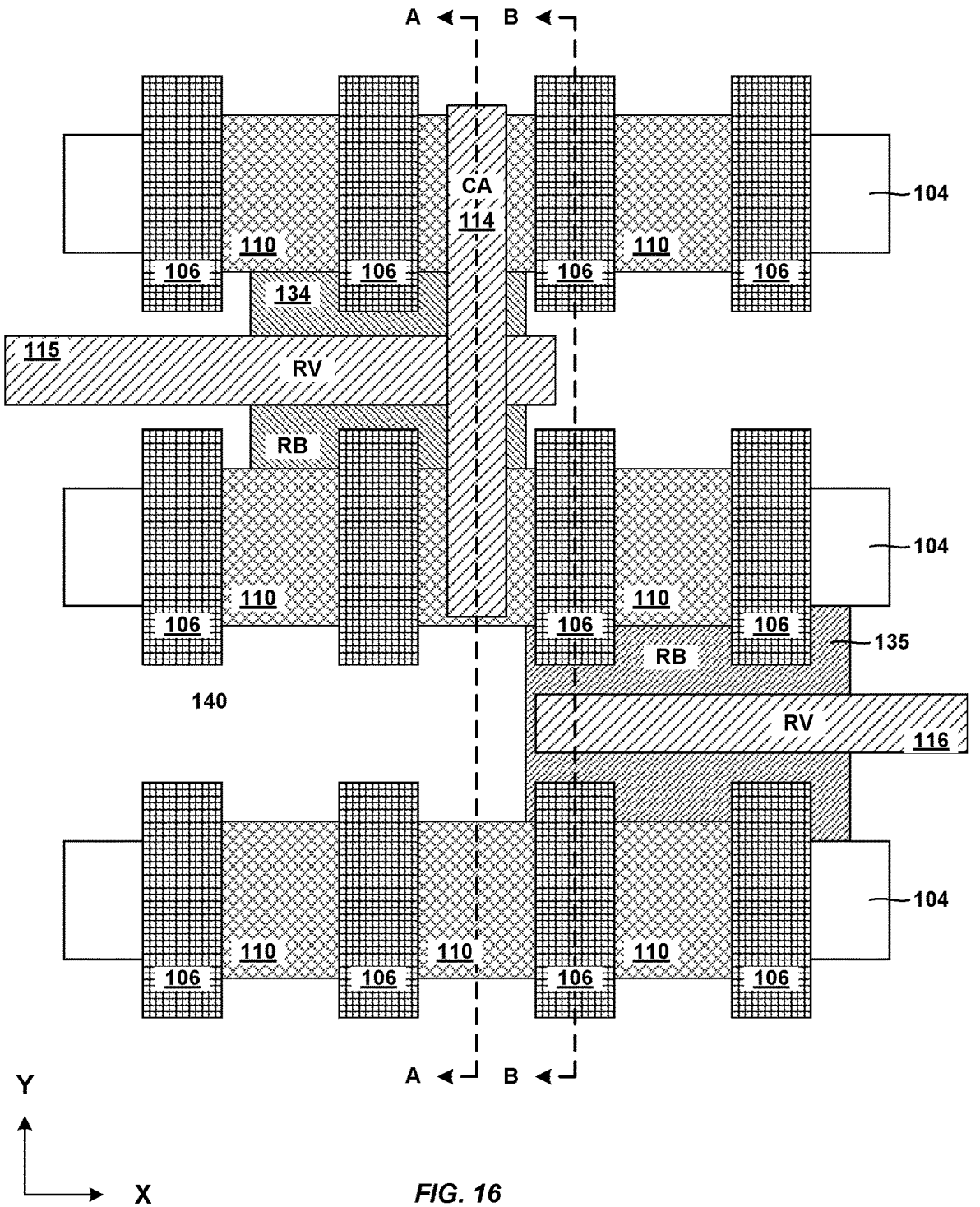
FIGS. 16, 17, and 18 depict views of a semiconductor structure after forming a MIM structure according to an exemplary embodiment.
Figure 17:
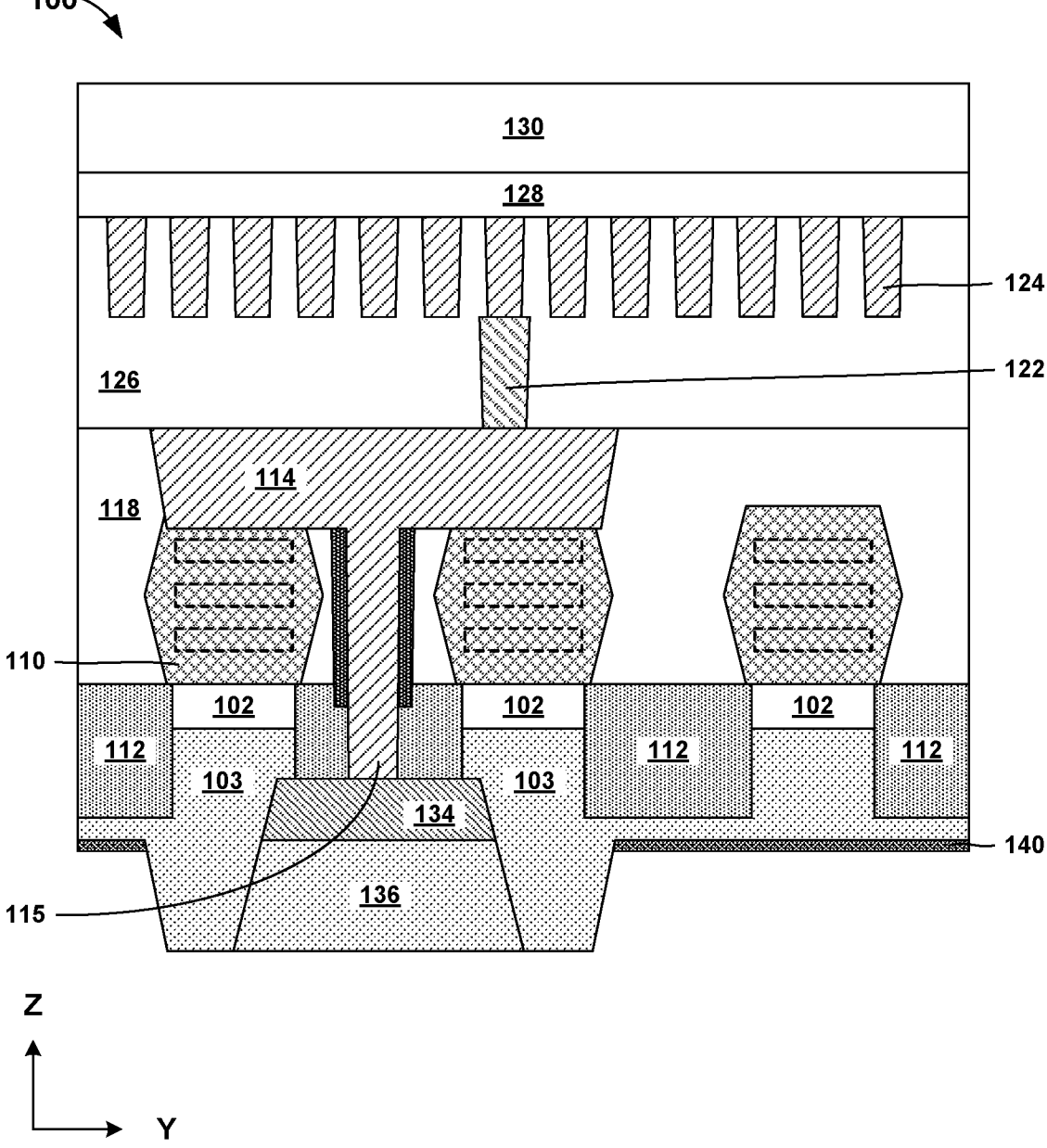
Figure 18:
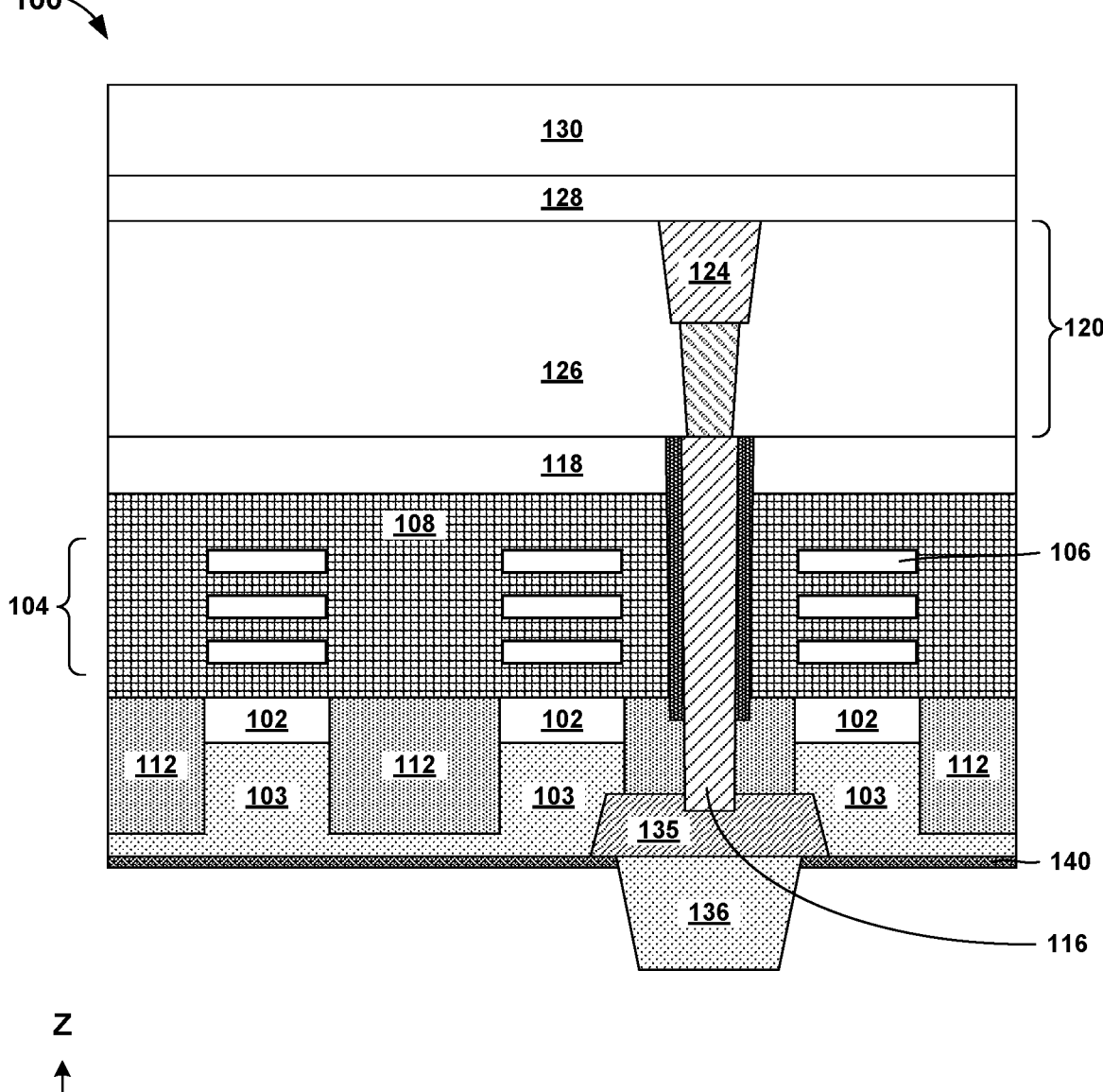

Referring now to FIGS. 16, 17, and 18, the structure 100 is shown after forming a MIM capacitor structure 140 according to an embodiment of the invention. FIG. 16 is a representative illustration of a top view of the structure 100 omitting some features as described above with reference to FIG. 1. FIG. 17 depicts a cross-sectional view of the structure 100 shown in FIG. 16 taken along line A-A. FIG. 18 depicts a cross-sectional view of the structure 100 shown in FIG. 16 taken along line B-B.

The MIM capacitor structure 140 is formed by sequential deposition of a first metal layer, an insulator layer, and a second metal layer over the structure 100 according to known techniques. Specifically, the MIM capacitor structure 140 is formed on, and covers exposed dielectrics, for example, the first backfill dielectric layer 136 and the buried dielectric layer 103, as illustrated. Furthermore, the first metal layer of the MIM capacitor structure 140 is formed in direct contact with lowermost surfaces of the backside signal lines 135, and the MIM capacitor structure 140 does not contact the backside power rails 134, at least in illustrated cross sections.

Portions of the MIM capacitor structure 140 can be selectively removed according to known techniques. For example, any suitable method, such as a wet etch, a dry etch, or a combination of sequential wet and/or dry etches can be used to selectively remove the portions of the first metal layer, the insulator layer, and the second metal layer. More specifically, the first metal layer, the insulator layer, and the second metal layer can be patterned or etched to expose surfaces of the first backfill dielectric layer 136, as illustrated. Said differently, portions of the first metal layer, the insulator layer, and the second metal layer are removed to leave a substantially flat or horizontal MIM capacitor structure 140.

Figure 19:
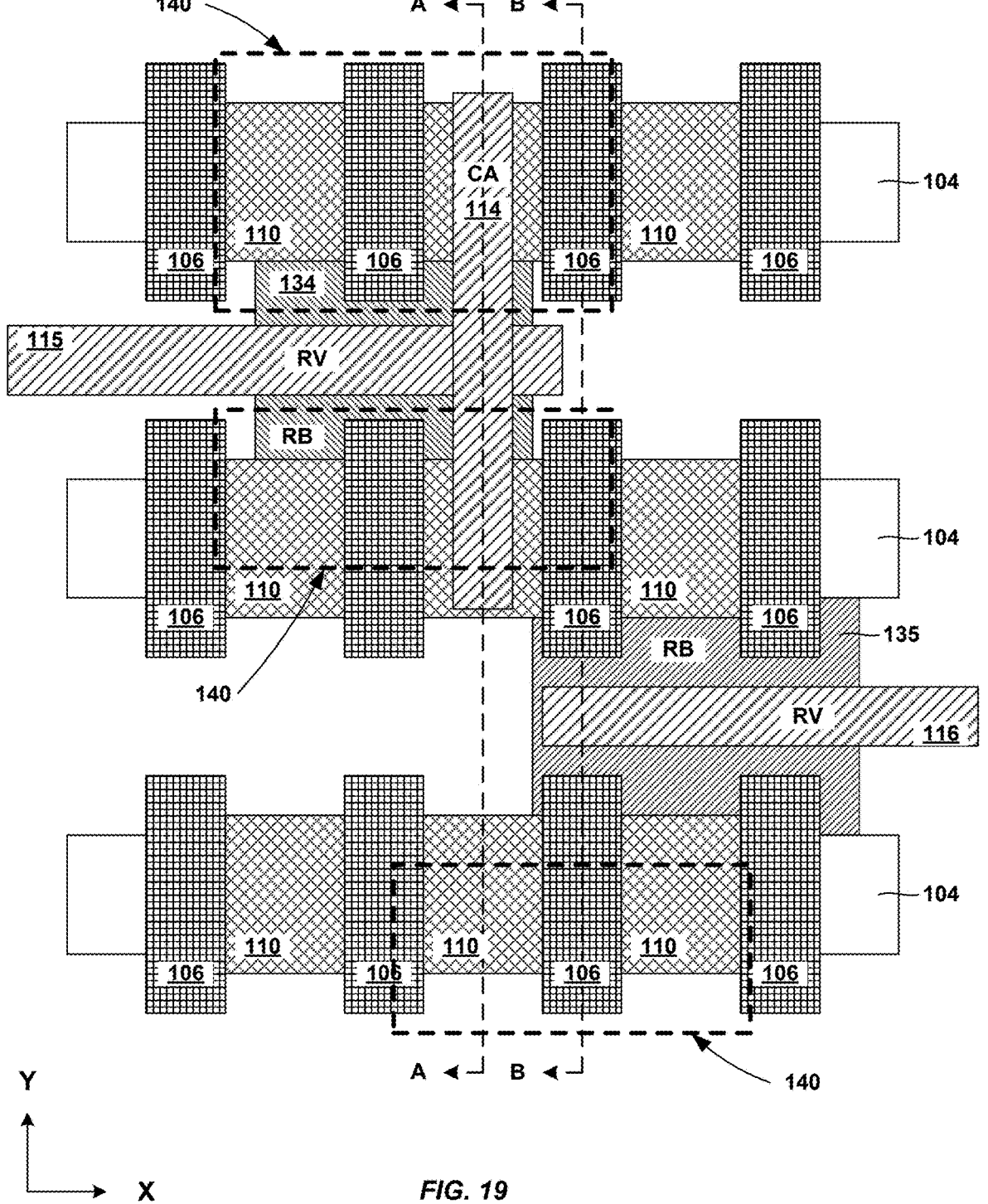
FIGS. 19, 20, 21, and 22 depict views of a semiconductor structure after forming a second backfill dielectric layer according to an exemplary embodiment.
Figure 20:
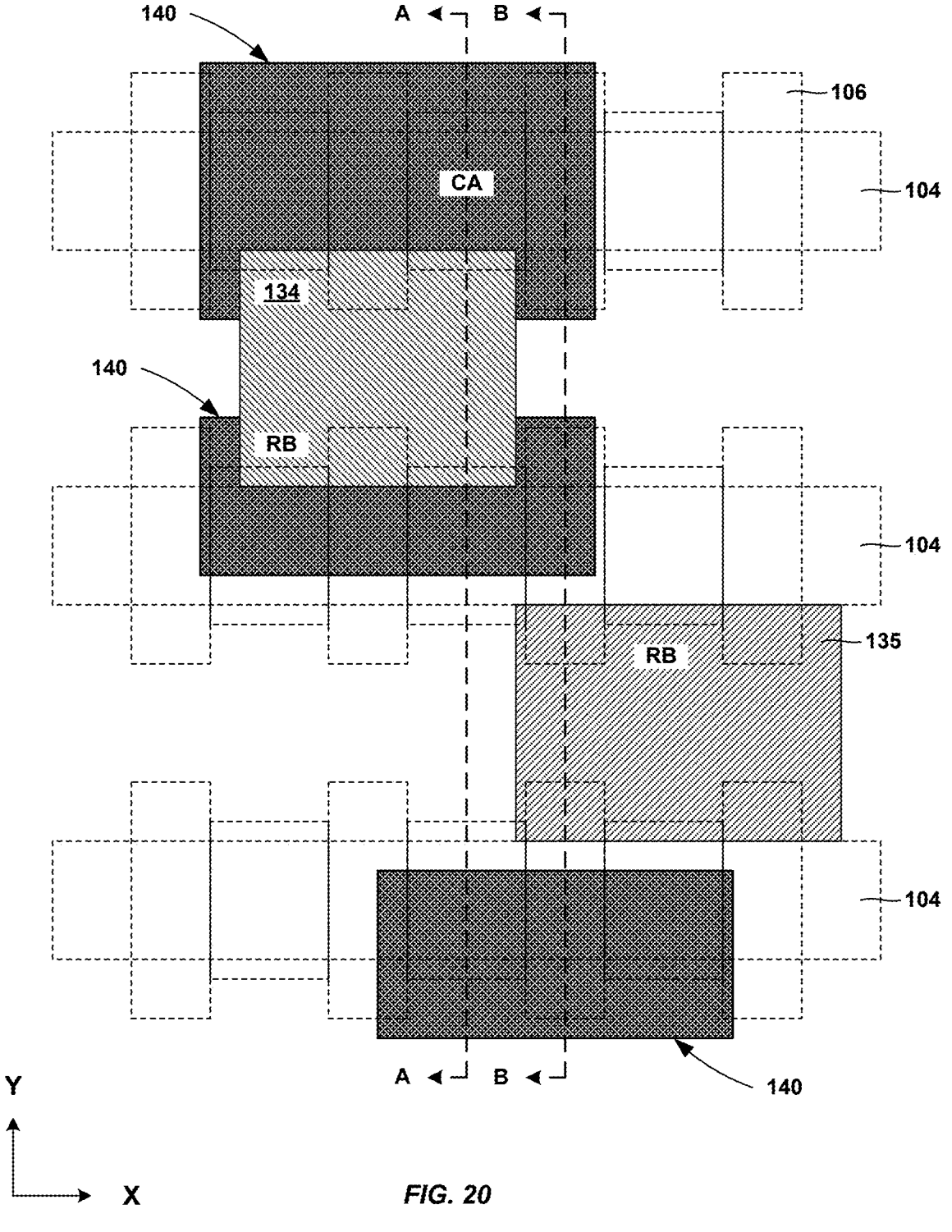
Figure 21:
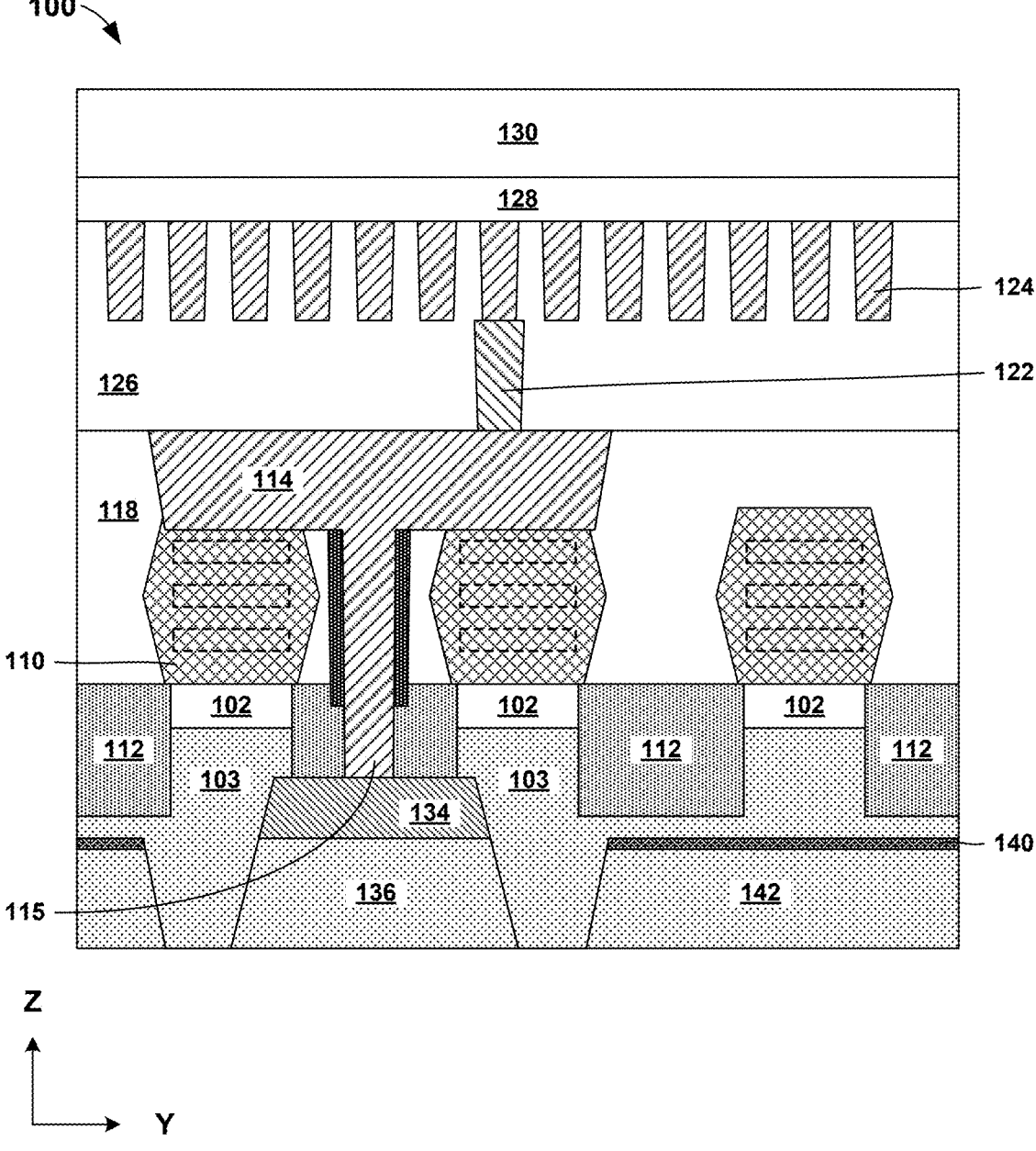
Figure 22:
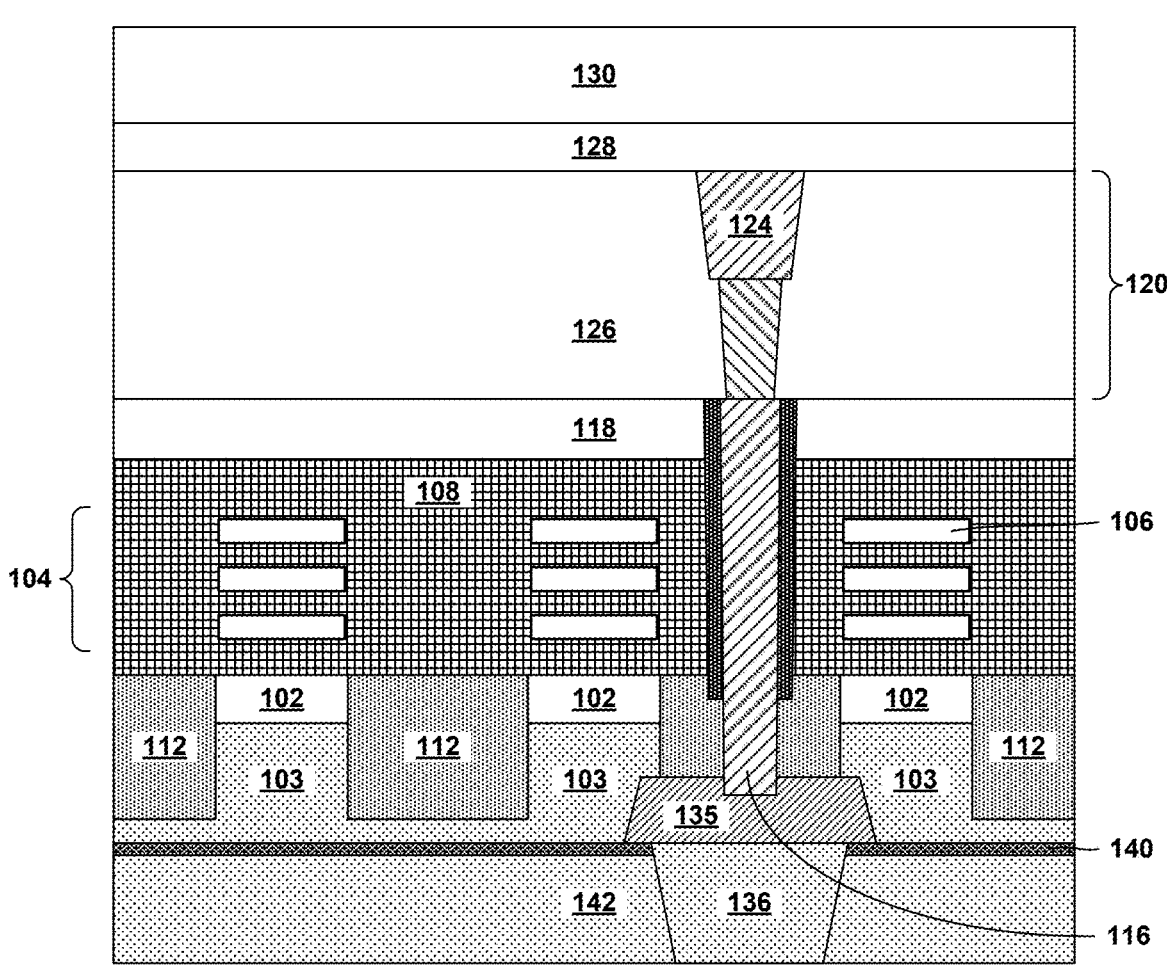

Referring now to FIGS. 19, 20, 21, and 22, the structure 100 is shown after forming a second backfill dielectric layer 142 according to an embodiment of the invention. FIGS. 19 and 20 are representative illustrations of a top view of the structure 100 omitting some features as described above with reference to FIG. 1. FIG. 21 depicts a cross-sectional view of the structure 100 shown in FIGS. 19 and 20 taken along line A-A. FIG. 22 depicts a cross-sectional view of the structure 100 shown in FIGS. 19 and 20 taken along line B-B.

The second backfill dielectric layer 142 is formed by blanket depositing another interlayer dielectric material over the structure 100 according to known techniques and as illustrated. Specifically, the second backfill dielectric layer 142 is formed on, and covers, the MIM capacitor structure 140, as illustrated.

Additionally, the second backfill dielectric layer 142 can be made from the same or different dielectric materials as the first backfill dielectric layer 136 or the buried dielectric layer 103 described above. As such, despite the second backfill dielectric layer 142, the first backfill dielectric layer 136, and the buried dielectric layer 103 being depicted and described as separate structures, or layers, they may not be distinguishable in the final structure if made from the same, or similar, dielectric material.

After forming the second backfill dielectric layer 142 conventional processes may continue for example formation of additional backside wiring and/or backside contacts. Such wiring and contacts may be used to form electrical connections with the backside wiring including, for example the backside power rails 134 and the backside signal lines 135, and the MIM capacitor structure 140.

As illustrated in FIGS. 19-22, the semiconductor structure represented by the structure 100 has some distinctive notable features. As described herein, the unique backside metal-insulator-metal capacitors disclosed herein, specifically the MIM capacitor structure 140, have some advantages over FET capacitors. For example, (1) the MIM capacitor structure 140 capacitance is constant over applied input voltage and (2) the MIM capacitor structure 140 capacitance is highly linear across their operating voltage range.

Although MIM capacitors can be fabricated and arranged in the back-end-of-line, they require, and thus consume, a relatively large amount of valuable space and generally require complicated multi-step processes. Moreover, general MIM capacitors arranged in the back-end-of-line cannot always be used as a de-coupling capacitor because of parallel resistance restrictions. In contrast, the MIM capacitor structure 140 disclosed herein are arranged on the backside of the structure 100. In doing so, the MIM capacitor structure 140 consumes less space than similar MIM capacitors in the back-end-of-line, and the MIM capacitor structure 140 can easily be used as a de-coupling capacitor.

In sum, the MIM capacitor structure 140 disclosed herein can replace many functions offered by FEOL FET capacitors or BEOL MIM capacitors with compatible or better performance and significant chip area reduction.

With specific reference to FIG. 20, the backside power rails 134 and the backside signal lines 135 and the MIM capacitor structure 140 are emphasized relative to the surrounding structures. Unique to the embodiments disclosed herein, as illustrated in FIG. 20, arrangement and wiring of the MIM capacitor structure 140 is entirely customizable. Specifically, as shown, portions of the MIM capacitor structure 140 can be arranged to overlap and directly contact the backside signal lines 135, while other portions of the MIM capacitor structure 140 can be arranged to avoid contact with the backside power rails 134. In other embodiments, portions of the MIM capacitor structure 140 can be arranged to avoid contact with the backside power rails 134, while other portions of the MIM capacitor structure 140 can be arranged to overlap and directly contact the backside signal lines 135.

It is appreciated by persons having ordinary skill in the art that the size and shape of the MIM capacitor structure 140 are not limited to the square or rectangle shapes as illustrated, but may be any shape and size to accommodate the physical and electrical design constraints. For example, the MIM capacitor structure 140 illustrated in FIG. 20 may be narrower or wider than illustrated. In yet another example, the MIM capacitor structure 140 may have unique shapes with jogs, bends, or curves as necessary.

With continued reference to FIGS. 19-22, and according to an embodiment, the structure 100 includes an array of transistors, a backside power rail, where the backside power rail directly contacts a bottommost surface of a shallow trench isolation region, and a metal-insulator-metal (MIM) capacitor embedded in a backside power delivery network beneath the array of transistors, where the MIM capacitor directly contacts a bottommost surface of the backside power rail.

With continued reference to FIGS. 19-22, and according to an embodiment, the structure 100 further includes a first via electrically connecting a source drain contact to the backside power delivery network, and a second via electrically connecting frontside wiring to the backside power delivery network.

With continued reference to FIGS. 19-22, and according to an embodiment, the backside power delivery network and a metal layer of the MIM capacitor are embedded in a backside dielectric layer.

With continued reference to FIGS. 19-22, and according to an embodiment, a metal layer of the MIM capacitor directly contacts the backside power delivery network in a region directly below a gate.

With continued reference to FIGS. 19-22, and according to an embodiment, a backside dielectric layer physically separates the metal layer of the MIM capacitor from the backside power delivery network in a region directly below a source drain region of at least one transistor of the array of transistors.

With continued reference to FIGS. 19-22, and according to an embodiment, the structure 100 further includes backside wiring in direct contact with a metal layer of the MIM capacitor.

With continued reference to FIGS. 19-22, and according to an embodiment, the array of transistors comprises an array of nanosheet transistors.

With continued reference to FIGS. 19-22, and according to an embodiment, the structure 100 includes an array of transistors, a backside power rail, and a metal-insulator-metal (MIM) capacitor beneath the array of transistors, where a metal layer of the MIM capacitor directly contacts the backside power rail.

With continued reference to FIGS. 19-22, and according to an embodiment, the structure 100 includes an array of transistors, a backside power rail, and a metal-insulator-metal (MIM) capacitor beneath the array of transistors, where a metal layer of the MIM capacitor directly contacts the backside power rail.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   an array of transistors;
   a backside power rail, wherein the backside power rail directly contacts a bottommost surface of a shallow trench isolation region; and
   a metal-insulator-metal (MIM) capacitor embedded in a backside power delivery network beneath the array of transistors, wherein the MIM capacitor directly contacts a bottommost surface of the backside power rail.

2. The semiconductor structure according to claim 1, further comprising:
   a first via electrically connecting a source drain contact to the backside power delivery network; and
   a second via electrically connecting frontside wiring to the backside power delivery network.

3. The semiconductor structure according to claim 1, wherein the backside power delivery network and a metal layer of the MIM capacitor are embedded in a backside dielectric layer.

4. The semiconductor structure according to claim 1, wherein a metal layer of the MIM capacitor directly contacts the backside power delivery network in a region directly below a gate.

5. The semiconductor structure according to claim 1, wherein a backside dielectric layer physically separates a metal layer of the MIM capacitor from the backside power delivery network in a region directly below a source drain region of at least one transistor of the array of transistors.

6. The semiconductor structure according to claim 1, further comprising:
   backside wiring in direct contact with a metal layer of the MIM capacitor.

7. The semiconductor structure according to claim 1, wherein the array of transistors comprises an array of nanosheet transistors.

8. A semiconductor structure comprising:
   an array of transistors;
   a backside power rail; and
   a metal-insulator-metal (MIM) capacitor beneath the array of transistors, wherein a metal layer of the MIM capacitor directly contacts the backside power rail.

9. The semiconductor structure according to claim 8, further comprising:
   a first via electrically connecting a source drain contact to a backside power delivery network; and
   a second via electrically connecting frontside wiring to the backside power rail.

10. The semiconductor structure according to claim 8, wherein the backside power rail and the metal layer of the MIM capacitor are embedded in a backside dielectric layer.

11. The semiconductor structure according to claim 8, wherein a metal layer of the MIM capacitor directly contacts a backside power delivery network in a region directly below a gate.

12. The semiconductor structure according to claim 8, wherein a backside dielectric layer physically separates the metal layer of the MIM capacitor from a backside power delivery network in a region directly below a source drain region of at least one transistor of the array of transistors.

13. The semiconductor structure according to claim 8, further comprising:
   backside wiring in direct contact with the metal layer of the MIM capacitor.

14. The semiconductor structure according to claim 8, wherein the array of transistors comprises an array of nanosheet transistors.

* * * * *